(12) United States Patent
Lou et al.

(10) Patent No.: US 11,422,460 B2
(45) Date of Patent: Aug. 23, 2022

(54) ALIGNMENT CONTROL IN NANOIMPRINT LITHOGRAPHY USING FEEDBACK AND FEEDFORWARD CONTROL

(71) Applicant: CANON KABUSHIKI KAISHA, Tokyo (JP)

(72) Inventors: Mingji Lou, Cedar Park, TX (US); Jeffrey D. Klein, Austin, TX (US); Takahiro Yoshida, Austin, TX (US); Steven T. Jenkins, Round Rock, TX (US); Byung-Jin Choi, Austin, TX (US)

(73) Assignee: Canon Kabushiki Kaisha, Tokyo (JP)

(*) Notice: Subject to any disclaimer, the term of this patent is extended or adjusted under 35 U.S.C. 154(b) by 242 days.

(21) Appl. No.: 16/712,739

(22) Filed: Dec. 12, 2019

(65) Prior Publication Data

US 2021/0181622 A1 Jun. 17, 2021

(51) Int. Cl.
*G03F 7/00* (2006.01)
*H01L 21/68* (2006.01)
(Continued)

(52) U.S. Cl.
CPC ...... *G03F 7/0002* (2013.01); *H01L 21/67092* (2013.01); *H01L 21/681* (2013.01); *H01L 23/544* (2013.01); *H01L 2223/54426* (2013.01)

(58) Field of Classification Search
None
See application file for complete search history.

(56) References Cited

U.S. PATENT DOCUMENTS 5,459,624 A 10/1995 Erickson et al.
6,185,467 B1 2/2001 Romano et al.
(Continued)

FOREIGN PATENT DOCUMENTS

EP 2388119 B1 9/2016
JP 3427944 B2 7/2003
JP 3501304 B2 3/2004

OTHER PUBLICATIONS

Atsumi, T. et al. "Track-following Control Using Resonant Filter in Hard Disk Drives", Proceedings of the 2007 American Control Conference, Jul. 2017, pp. 61-67 (Year: 2017).*

(Continued)

*Primary Examiner* — Robert J Grun
(74) *Attorney, Agent, or Firm* — Canon U.S.A., Inc., IP Division

(57) ABSTRACT

A method and system for controlling a position of a moveable stage having a substrate supported thereon is provided. First position information representing a position of the substrate relative to a mark on an object is obtained from a sensor. Alignment prediction information is generated based on the obtained first position wherein the generated alignment prediction information including at least one parameter value. First trajectory information is generated and includes the at least one parameter value based on the obtained first position information and the generated alignment prediction information. Second trajectory information is generated based on the generated alignment prediction information first trajectory information and second position information, wherein the second position information represents a position of the moveable stage. An output control signal is generated based on the second trajectory information and used to control the moveable stage to approach a target position based on the generated output signal.

23 Claims, 8 Drawing Sheets

(51) Int. Cl.
*H01L 23/544* (2006.01)
*H01L 21/67* (2006.01)

(56) References Cited

U.S. PATENT DOCUMENTS

| | | |
|---|---|---|
| 6,236,895 B1 | 5/2001 | Romano et al. |
| 6,798,611 B1 | 9/2004 | Romano et al. |
| 7,719,782 B1 | 5/2010 | Bates et al. |
| 8,508,881 B1 | 8/2013 | Babinski et al. |
| 8,929,022 B1 | 1/2015 | Huang et al. |
| 8,953,278 B1 | 2/2015 | Zhou et al. |
| 9,053,724 B1 | 6/2015 | Chahwan et al. |
| 9,111,575 B1 | 8/2015 | Zhou et al. |
| 9,142,234 B1 | 9/2015 | Lou et al. |
| 9,142,235 B1 | 9/2015 | Babinski et al. |
| 9,147,818 B2 | 9/2015 | Shiobara et al. |
| 9,208,815 B1 | 12/2015 | Lou et al. |
| 9,378,722 B2 | 6/2016 | Butler et al. |
| 9,418,689 B2 | 8/2016 | Lou et al. |
| 10,012,977 B2 | 7/2018 | Ono et al. |
| 2006/0007592 A1 | 1/2006 | Takaishi et al. |
| 2006/0082922 A1 | 4/2006 | Shih |
| 2006/0254446 A1 | 11/2006 | Lof |
| 2007/0278712 A1 | 12/2007 | Okushima et al. |
| 2010/0314799 A1 | 12/2010 | Suehira et al. |
| 2013/0266682 A1 | 10/2013 | Khusnatdinov et al. |

OTHER PUBLICATIONS

Atsumi, T., et al., "Track-following Control Using Resonant Filter in Hard Disk Drives", Proceedings of the 2007 American Control Conference, Jul. 2017, pp. 61-67.

* cited by examiner

ALIGNMENT CONTROL IN NANOIMPRINT LITHOGRAPHY USING FEEDBACK AND FEEDFORWARD CONTROL

TECHNICAL FIELD

The disclosure relates to alignment control in nanoimprint lithography, more specifically to real time feedback and feedforward control.

BACKGROUND

In nanoimprint lithography, techniques for field to field alignment have been used to achieve nanometer level overlay accuracy. In some examples, an initial alignment error between an imprint template and a corresponding field on a substrate can be corrected by moving the template relative to the substrate (e.g., a wafer). However, fast and consistent alignment for nanoimprint lithography is a challenge. More specifically, thin-liquid friction and variation of initial status are two major difficulties. Current alignment schemes typically make use of a single control algorithm that can be manually tuned via tuning knobs. In addition to the conventional drawbacks associated with manually tuning a control algorithm such as time delay to implement a modification to the control algorithm, the variation and nonlinearity of the current scheme was not sufficient to handle different RLT (residual layer thickness of curable liquid between the template and the substrate), location, and transition process. This resulted in various problems including slow alignment converge, alignment overshoot, alignment undershoot, stalling, oscillation and repeatability problems. These issues consistently impact the yield and efficiency of mass production and it is therefore desirous for them to be corrected.

SUMMARY

According to present disclosure, a method of controlling a position of a moveable stage having a substrate supported thereon is provided. First position information representing a position of the substrate relative to a mark on an object is obtained from a sensor. Alignment prediction information is generated based on the obtained first position wherein the generated alignment prediction information including at least one parameter value. First trajectory information is generated and includes the at least one parameter value based on the obtained first position information and the generated alignment prediction information. Second trajectory information is generated based on the generated alignment prediction information first trajectory information and second position information, wherein the second position information represents a position of the moveable stage. An output control signal is generated based on the second trajectory information and used to control the moveable stage to approach a target position based on the generated output signal.

In a further embodiment according the present disclosure, an error value is determined based on the sensor representing the position of the substrate relative to the mark on the object that was moved in accordance with the second trajectory information and generating an updated output control signal based on the error value is within a predetermined range and is used in controlling the moveable stage to approach the target position based on the updated output control signal.

In other embodiments according to the present disclosure, the alignment prediction information is updated and the at least one parameter values included therein based on updated first position information obtained by an image capturing device after the moveable stage has moved according to the output control signal.

According the present disclosure, the alignment prediction information is a first feed-forward signal, and the generated first trajectory information is a first feedback signal generated by obtaining a difference between the obtained first position information and the feed-forward alignment prediction information and the generated second trajectory information is a second feedback signal.

The present disclosure provides a further embodiment that provides for, in response to determining an error values based on the sensor representing the position of the substrate relative to the mark on the object at an end position of the alignment prediction information is outside a predetermined range, generating a new alignment prediction information including updated at least one parameter values determined based on an updated first position information and combining the new alignment prediction information with the second trajectory information to generate an updated output control signal such that the moveable stage is controlled based on the updated output control signal. As such, the output control signal is further based on combination of a third feedforward control signal and the second trajectory information.

Advantages of the general aspects and implementations described herein include feedforward and feedback control of alignment errors based on real-time system identification, resulting in rapid and accurate correction of alignment errors in imprint lithography. The rapid and accurate correction with smooth transition of substrate movement into an alignment condition results in improved alignment throughput and overlay accuracy.

The details of one or more implementations of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
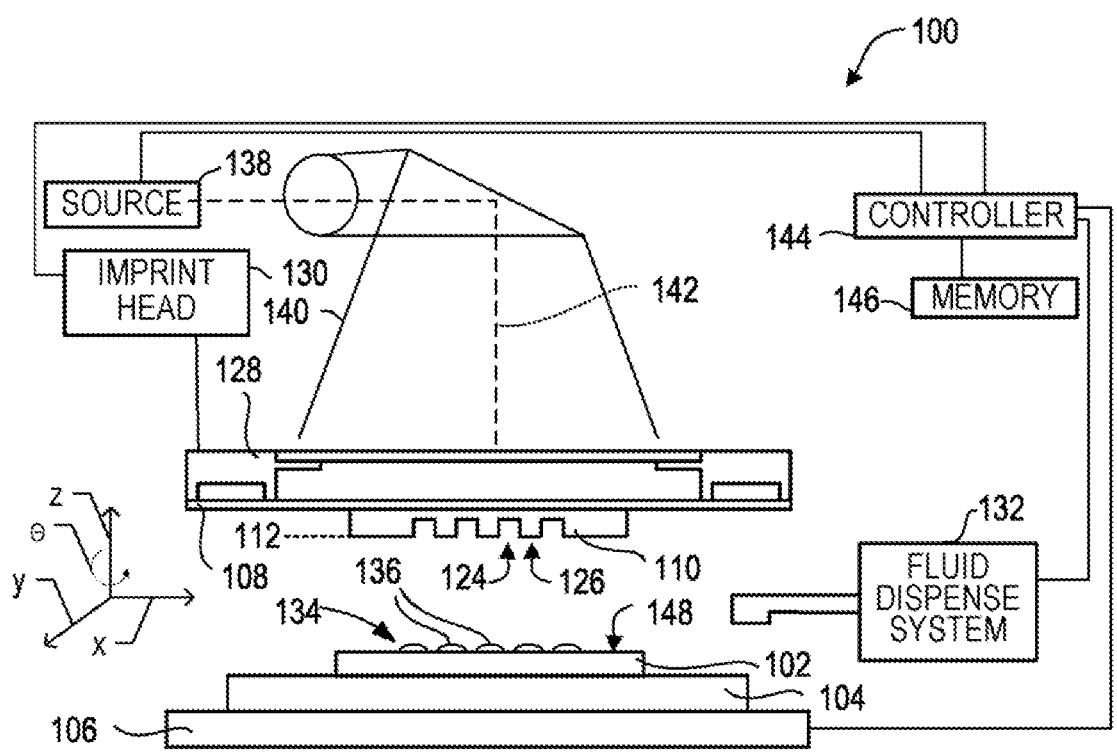
FIG. 1 depicts a side view of a nanoimprint lithography system.

FIG. 1 illustrates an imprint lithography system 100 that forms a relief pattern on a substrate 102. The substrate 102 may be coupled to a substrate chuck 104. In some examples, the substrate chuck 104 includes a vacuum chuck, a pin-type chuck, a groove-type chuck, an electromagnetic chuck, or other appropriate chuck. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes as well as rotation (e.g., θ) about the z-axis. In this regard, the stage 106 may refer to an XYθ stage. The stage 106, the substrate 102, and the substrate chuck 104 may also be positioned on a base (not shown).

The imprint lithography system 100 includes an imprint lithography template 108 that is spaced apart from the substrate 102. In some examples, the template 108 includes a mesa 110 (mold 110) that extends from the template 108 toward the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, or other appropriate material. In the illustrated example, the patterning surface 112 includes a plurality of features defined by spaced-apart recesses 124 and protrusions 126. The pattern being formed as described above is for purposes of example only and any type of pattern may be represented on the patterning surface 112. As such, the patterning surface 112 may define any pattern that forms the basis of a pattern to be formed, via imprint processing, on substrate 102.

The template 108 may be coupled to a template chuck 128. In some examples, the template chuck 128 includes a vacuum chuck, a pin-type chuck, a groove-type chuck, an electromagnetic chuck, or any appropriate chuck. Exemplary chucks are described in U.S. Pat. No. 6,873,087. In some embodiments, the template chuck 128 may be of the same type as the substrate chuck 104. In other embodiments, the template chuck 128 and substrate chuck may be different types of chucks. Further, the template chuck 128 may be coupled to an imprint head 130 such that the template chuck 128, the imprint head 130, or both are configured to facilitate movement of the template 108. Movement of the template 108 includes movement in the plane of the template (in-plane movement) and movement out of the plane of the template (out-of-plane movement) with respect to the template. In-plane movement includes translation of the template 108 in the plane of the template (e.g., in the X-Y plane as depicted in FIG. 1) and rotation of the template in the plane of the template (e.g., in the X-Y plane and about the Z axis). Translation or rotation of the template 108 with respect to the substrate 102 may also be achieved by translation or rotation of the substrate. In-plane movement of the template 108 also includes increasing or decreasing a compression force on opposite sides of the template (e.g., with a magnification actuator) to increase or decrease dimensions of the template in the X-Y plane of the template. Out-of-plane movement of the template 108 includes translation of the template along the Z-axis (e.g., to increase or decrease a force applied to the substrate via the template by increasing or decreasing the distance between the template and the substrate) and rotation of the template about an axis in the X-Y plane of the template. Rotation of template 108 about an axis in the X-Y plane of the template changes an angle between the X-Y plane of the template 108 and the X-Y plane of substrate 102, and is referred herein to as "tilting" the template with respect to the substrate, or changing a "tilt" or "tilt angle" of the template with respect to the substrate. U.S. Pat. No. 8,387,482 discloses movement of a template via an imprint head in an imprint lithography system, and is incorporated by reference herein.

The imprint lithography system 100 may further include a fluid dispense system 132. The fluid dispense system 132 may be used to deposit a polymerizable material 134 on the substrate 102. The polymerizable material 134 may be disposed on the substrate 102 using techniques such as drop dispense, spin-coating, dip coating, chemical vapor deposition (CVD), physical vapor deposition (PVD), thin film deposition, thick film deposition, or other appropriate method. In some examples, the polymerizable material 134 is disposed on the substrate 102 before or after a desired volume is defined between the mold 110 and the substrate 102. The polymerizable material 134 may include monomers as described in U.S. Pat. No. 7,157,036 and U.S. Patent Application Publication No. 2005/0187339, both of which are incorporated by reference herein. In some examples, the polymerizable material 134 is disposed on the substrate 102 as a plurality of droplets 136.

Figure 2:
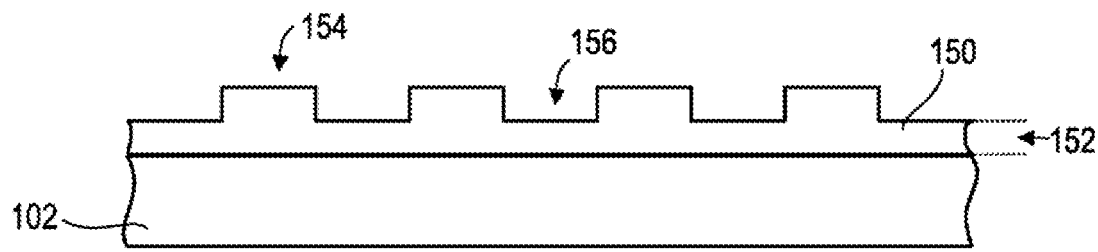
FIG. 2 depicts a side view of the substrate of FIG. 1.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 100 may be regulated by a controller 144 in communication with the stage 106, the imprint head 130, the fluid dispense system 132, the energy source 138, or any combination thereof, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, such as broadband ultraviolet radiation, causing the polymerizable material 134 to polymerize and to conform to the shape of a surface 148 of the substrate 102 and the patterning surface 112, defining a polymeric patterned layer 150 on the substrate 102. In some examples, the patterned layer 150 includes a residual layer 152 and a plurality of features shown as protrusions 154 and recessions 156, with the protrusions 154 having a thickness t1 and the residual layer 152 having a thickness t2.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, all of which are incorporated by reference herein.

Imprint lithography substrates and templates may include corresponding pairs of alignment marks that allow real-time alignment of the template and the substrate. After the patterned template is positioned over the substrate (e.g., superimposed over the substrate), an alignment of the template alignment marks with respect to the substrate alignment marks is determined. Alignment schemes may include "through the mesa" (TTM) measurement of alignment errors associated with pairs of corresponding alignment marks, followed by compensation of these errors to achieve accurate alignment of the template and a desired imprint location on the substrate as disclosed in U.S. Pat. Nos. 6,916,585;

7,170,589; 7,298,456; and 7,420,654, all of which are incorporated by reference herein. Alignment errors may be caused by relative positioning of the substrate and the template, deformation of the substrate or the template, or a combination thereof.

Figure 3:
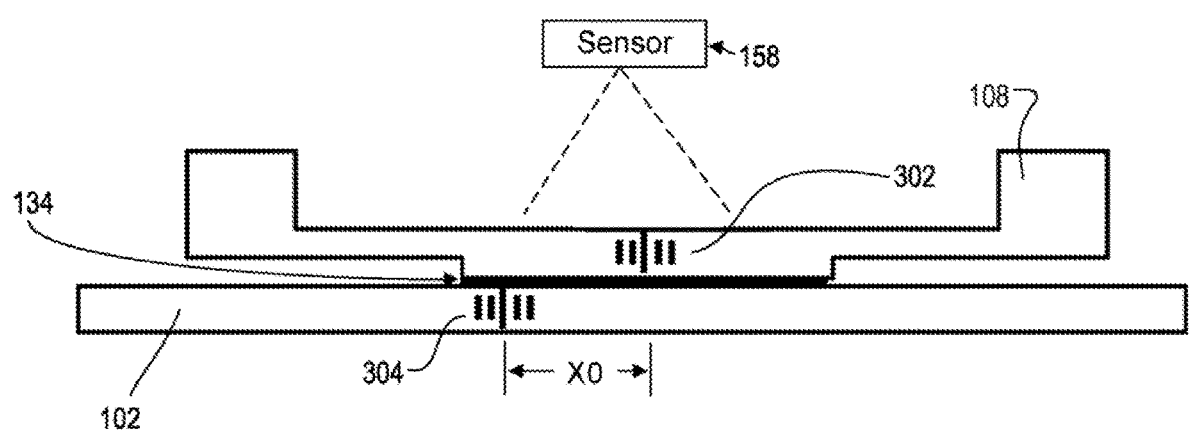
FIG. 3 depicts a side view of a nanoimprint lithography template in contact with a liquid imprint resist on a substrate, showing an initial alignment error X0 between an example pair of alignment marks on the template and the substrate, respectively.

FIG. 3 illustrates a side view of an imprint lithography template 108 in contact with a liquid imprint resist 134 on a substrate 102, showing a first or initial alignment error X0 between an example pair of alignment marks 302 and 304 on the template 108 and the substrate 102, respectively. The alignment error X0 may be measured by an image capturing device such as a sensor 158. In some examples, the sensor 158 includes a TTM alignment instrument configured to detect diffracted light from the alignment marks 302 and 304 in which the diffractive light may pass through the liquid imprint resist 134. The initial alignment error X0 may exceed a tolerable alignment error, which can be less than 10 nm with a repeatability of 1 nm or less, for instance. While the sensor 158 is described as an image capturing device, this is merely exemplary and the image capturing device may include any device able to detect, capture and transmit diffracted light in real-time.

The alignment error X0 may primarily be caused by placement error, rotation error, and/or compliance and hysteresis of the stage 106 (e.g., an XYθ stage), and may include the errors in the x- and y-axes and a rotation about the z-axis (θ). For example, the placement error generally refers to X-Y positioning errors between a template and substrate (that is, translation along the X axis, the Y axis, or both, where the X and Y axes are in the plane of or parallel to the imprinting surface of the template or the substrate, as depicted in FIG. 1). The rotation (θ) error generally refers to the relative orientation error about the Z axis (that is, rotation about the Z axis, where the Z axis is orthogonal to the X-Y plane as depicted in FIG. 1).

Placement errors in which a template alignment mark 302 and a corresponding substrate alignment mark 304 are offset in the X-Y plane may be compensated for by relative movement of the template and the substrate (e.g., by controlled movement of the substrate, the template, or both in the X-Y plane). Rotation errors may be compensated for by altering the relative angle of the template and substrate in the X-Y plane (e.g., by rotation of the substrate, the template, or both).

The present disclosure sets forth a control mechanism for controlling the operation of the imprint system described hereinabove with respect to FIGS. 1-3 to reduce an amount of time it takes for the alignment marks 302 and 304 to converge for proper alignment in order to ensure that the pattern defined on the mesa 110 is successfully imprinted on the substrate 102. In other words, a control algorithm will be described below to bring a reduced error value generically indicated by X0 to be below a predetermined error threshold within a predetermined period of time. Preferably, the outcome will result in a relative distance between the mark on the template to the mark on the substrate being less than a predetermined distance value. However, there has been a certain difficulty in bringing this error value to an acceptable level within an acceptable period of time due to various physical characteristics of both the substrate and the polymer used for imprinting the pattern thereon. More specifically, from the time that the polymer (e.g. imprint resist) is deposited on the substrate and energy applied thereto during curing, it is challenging to bring the substrate and template in alignment such that relative distance between the alignment marks on each are within predetermined relative distance to one another.

In order to align the marks on the template and the substrate, a control signal is generated for controlling movement of the stage in the XYθ directions. The control signal includes one or more parameter values that are translated into electrical signals which are applied to a stage motor (not shown) for moving the stage to a desired target position. Parameter values that make up the control signal may be any one or more of acceleration values, velocity values, rotation values and time values indicative of a time at which movements are to occur.

Depending on the parameter values determined during alignment processing, one of two common issues results. One possible issue relates overshooting the target position because the one or more parameter values together result in a trajectory that causes the stage to move in such a manner that the mark on the substrate passes the mark on the template thereby requiring further correction for alignment. Another possible issue relates to stalling. Stalling is indicative of the parameter values of the control signal causing the stage to move too slowly. In this manner, the energy being applied through the template and onto the substrate causes the liquid resist to cure and polymerize resulting in the alignment processing stalling before the marks are aligned. These issues are remedied by using the control algorithm described herein by making use of at least two feedforward signals per sample that are integrated with feedback signals in order to continually modify and update the control signal that is used to cause the stage to move towards the target position. By continually monitoring the position information of the stage and substrate relative to the position of the template and using these measurements, the system as described herein successfully reduces the error value between the alignment marks more quickly without negatively impacting characteristics of the substrate 102 and within a predetermined amount of time before the polymerizable material 134 as polymerized.

Figure 4:
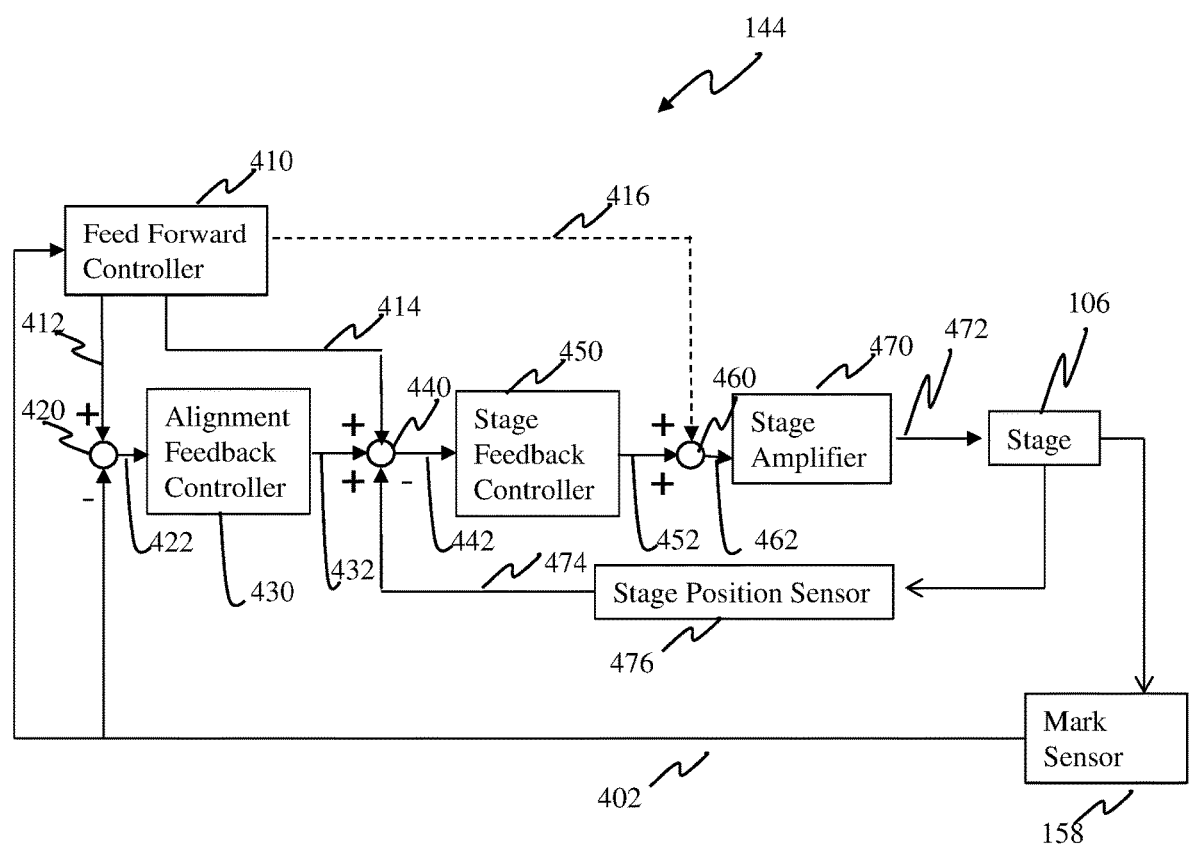
FIG. 4 depicts a block diagram illustrating feedforward and feedback control for use in aligning marks on the template and the substrate.

FIG. 4 illustrates an example control block diagram for feedforward and feedback control. The control system as described herein is shown embodied as part of the controller 144 in the system 100 shown in FIG. 1. The controller 144 includes at least one central processing unit (CPU) and memory and can execute instructions stored in the memory to perform one or more of the described operations and/or functions. The controller 144 is in communication with one or more memories (e.g. RAM and/or ROM) and, in some instances executes stored instructions to perform the one or control operations. In other instances, the controller 144 may temporarily store data in the one or more memories that are used in calculation and generation of the various signals described hereinafter. As such, the controller 144 controls the system 100 of FIG. 1 by using a computer program (one or more series of stored instructions executable by the CPU) and data stored in the RAM and/or ROM. Here, the controller 144 may include (or may be in communication with) one or more dedicated hardware or a graphics processing unit (GPU), which is different from the CPU, and the GPU or the dedicated hardware may perform a part of the processes by the CPU. As an example of the dedicated hardware, there are an application specific integrated circuit (ASIC), a field-programmable gate array (FPGA), and a digital signal processor (DSP), and the like. In one embodiment, the control system 100 may be implemented as part of a controller 144 as shown in FIG. 1. In some embodiments, the controller 144 may be a dedicated controller. In others, the control system 100 may include a plurality of controllers that are in communication with one another and other components of the control system 100 to implement the operations described herein.

Hereinbelow the block diagram of FIG. 4 which executes the control functionality according to the present disclosure will be described. While the following makes reference to various controllers, in certain embodiments, each controller may comprise a series of stored instructions that are executed by the CPU of controller 144 to perform the described functions. In other embodiments, each controller described herein may be embodied as individual integrated circuits each with their own CPUs and memories and are dedicated to perform the processing associated therewith. In other embodiments, one or more of the controllers described herein may be embodied as a single integrated circuit. Further, in some embodiments, some of the described controllers may be dedicated processing units and be in communication with the CPU of the controller which is executing stored instructions to complete the function operations described herein.

FIG. 4 includes the sensor 158, a feedforward controller 410, an alignment feedback controller 430, a stage feedback controller 450 and an stage amplifier 470 (hereinafter referred to as "amplifier 470"). Positioned between the above described components are a plurality of junctions which merge signals output by the respective controllers that feed them by adding, subtracting, or convoluting each other. Each of the above components operate as described hereinbelow in order to cause the stage supporting the substrate to move to a target position that represents an alignment error value within a predetermined alignment error range. In one embodiment, the target position represents an alignment error value of substantially zero indicating that the mark on the substrate is in direct alignment with the mark on the template.

Each of the alignment feedback controller 430 and the stage feedback controller 450 may execute as a proportional-integral-derivative (PID) controller or any other feedback controller. In doing so, an exemplary control function for processing respective input signals to generate output signals can be a control function such as $$u(t) = K_p e(t) + K_i \int_0^t e(t')dt' + K_d \frac{de(t)}{dt}$$

Where $K_p$, $K_i$ and $K_d$ represent proportional, integral and derivative control terms, respectively, for controlling the particular operation of the controller in which it is embodied. The manner in which this control function executed by the feedback controllers is known and need not further be described and continually calculates error values based on the inputs received therein. A first junction 420 is positioned between the feedforward controller 410 and the sensor 158 and generates a first input signal 422 to the alignment feedback controller 430 by obtaining a difference in a first feedforward control signal 412 and a measurement signal 402 that represents the position of the mark on the template relative to the mark on the substrate. The first feedforward signal 412 represents alignment reference trajectory information and is generated based on the measurement signal 402 and reference trajectory information stored in a memory. The first feedforward signal 412 includes at least one parameter that defines one or more aspects used to control a movement operation of the stage. For example, the at least one parameter may include one or more of (a) desired position value, (b) desired velocity value, (c) desired acceleration value; (d) a desired rotation value and (e) desired start time for initiating movement of the stage along a determined trajectory. The first feedforward signal may be a feedforward trajectory in Phase Plane (x-axis: position, y-axis: velocity) which is then mapped to the time domain (x-axis: time, y-axis: position) to generate the feedforward signal on a per sample basis. This trajectory in Phase Plane is optimized offline or online through iterative learning and model prediction based on friction variation observed from Feedforward and Feedback signals. This optimization is to achieve minimum overshoot and undershoot with minimum oscillation and converge time bringing the marks on the template and substrate in alignment with one another.

By making use of the real-time measured position of the substrate relative to the template along with reference trajectory information, the first feedforward signal 412 may represent a polynomial or exponential decay line in position-velocity phase plane that is transferred to the time domain. In this manner, by combining the alignment reference trajectory information of the first feedforward signal 412 with the measured position value encoded in the measurement signal 402 obtained, in real-time, from sensor 158, the alignment controller 430 can generate an alignment trajectory (sometimes referred to as a control command or control effort) that will align the marks on the substrate and template more quickly. The alignment controller 430 generates alignment trajectory information 432 based on the first input signal 422 and outputs the alignment trajectory information 432 to a second junction 440. In other words, the alignment feedback controller continually calculates an alignment error value according to the equation $$e_{TTM}(t)=FF_1(t)-POS_{TTM}(t)$$

where $e_{TTM}$ represents the error value at a given time, $FF_1$ is the value of the first feedforward signal 412 generated by the feedforward controller 410 and $POS_{TTM}$ is the current position of the template relative to the substrate supported by stage 106 which is obtained by sensor 158. After calculating the error value, the alignment feedback controller 430 outputs the alignment trajectory information as $U_{AL}(t)$. The alignment trajectory information 432 will be used, as described hereinbelow, to generate a trajectory (or control effort) along which a stage is caused to move in order to align the substrate and template.

The feedforward controller 410 further outputs a second feedforward control signal 414 to the second junction 440. In one embodiment, the first feedforward signal 412 and second feedforward signal 414 are the same. In another embodiment, the second feedforward signal is generated based on the first feedforward signal 412. For example, in one embodiment, the second feedforward signal 414 may be a magnitude or time shifted version of the first feedforward signal 412 where the first feedforward signal 412 is shifted to start from an initial starting time. For example, in one embodiment, the second feedforward signal 414 $FF_2$ may be a magnitude shifted version of the first feedforward signal 412 $FF_1$, where the first feedforward signal 412 is shifted in magnitude $FF_{shift}$ as described in the following equation.

$$FF_2(t)=FF_1(t)+FF_{shift}$$

Therefore, if the target position to which the stage is to be moved represents an alignment error of substantially zero, the second feedforward signal 414 has the same value as the first feedforward signal 412 but begins at the target position of zero as compared to the first feedforward signal 412 which begins at the measured position 402. Other examples of generating the second feedforward signal 414 include applying a transfer function $f(\ )$ to the first feedforward signal 412 as described by the following equation. Where $f(\ )$ is the nonlinear transfer including a time shift.

$$FF_2(t)=f(FF_1(t))$$

The transfer function $f(\ )$ may represent the nonlinear friction which causes desynchronization of the motion sensed by the stage position sensors 476 and the mark sensor 158. In another embodiment, the second feedforward signal 414 is generated independently of first feedforward signal 412.

In addition to the alignment trajectory information 432 and the second feedforward signal 414, the second junction 440 receives, as an input, stage position information 474 that is obtained from a stage position sensor 476 of the amplifier 470. The stage position information 474 represents a current measured position of the stage 106 at the conclusion of a stage movement operation requested by the amplifier 470. The second junction 440 combines the alignment information 432 with the second feedforward signal 414 and then obtains a difference between the combined signal and the stage position information 474 to generate a second input signal 442. The second input signal 442 is input to the stage feedback controller and generates stage trajectory information 452 as an output therefrom. While the stage position sensor 476 is shown separate from the stage 106, this is merely exemplary and shown to facilitate understanding of system operation. It should be understood that the stage position sensor 476 may be included in the stage 106.

It should be noted that the stage sensor feedback 474 sensed by the stage position sensor 476 and the mark sensor feedback 402 are not the same signal despite both feedback signals being derived from the operation of the stage 106 at each sample. This is because the mark sensor feedback 402 and stage sensor feedback 474 are not in the same coordinate space and are therefore not synchronized. With respect to the coordinates spaces in which these are present, the stage sensor feedback 474 has a home position which is typically set as zero and, in a global coordinate system, set the same as the whole apparatus (e.g. machine). However, the mark sensor feedback 402 is set at zero when a mark error between the template and the substrate is zero. This can be seen as X0 in FIG. 3. The coordinate space of the mark sensor 158 is a space that is related between the template and substrate. In other words, the coordinate space of the mark sensor 158 that generates the mark sensor feedback 402 is a local coordinate system. The prediction information embodied as the feed forward signals 412 and 414 are generated by considering the shift of both coordinate spaces.

In addition to the shift due to different coordinate spaces, nonlinear friction between the template and substrate may also cause nonlinear scaling, and time and magnitude shifts between the first feedforward signal 412 and second forward signal 414. For example, in an extreme case, very large friction between the substrate and template can result in the mark sensor 158 detecting that a stall (e.g. substrate and template sticking together) has occurred even though the stage sensor feedback 474 indicates that the stage 106 is moving. In an embodiment such as this, generation of the first and second feedforward signals 412 and 414 may require execution of a nonlinear transfer function as part of the operation of the feedforward controller 410.

The stage feedback controller 450 continually calculates the error value associated with a position of the stage as controlled by the amplifier 470. The error value may be calculated by the stage feedback controller 450 using the following equation:

$$e_{stage}(t)=U_{AL}(t)+FF_2(t)-POS_{stage}(t)$$

where $e_{stage}$ represents an error value of the position of the stage, $U_{AL}(t)$ represents the alignment trajectory information 432, $FF_2(t)$ which represents the second feedforward signal 414 (e.g. constant offset ($FF_{shift}$) added version of the $FF_1(t)$) and $POS_{stage}$ is a current position of the stage 106 operated by the amplifier 470 and sensed by the stage position sensor 476. In this processing, the second feedforward signal 414 ($FF_2(t)$) also includes values associated with the at least one parameter value from the first feedforward signal 412. In one embodiment, the parameter values in the second feedforward signal 414 are the same as those in the first feedforward signal 412 with the exception of an offset because of the above discussed constant offset added. In another embodiment, in view of the error value determined as part of the alignment trajectory information processing, the one or more of the at least one parameter values representing movement control (e.g. position, velocity, rotation, acceleration) may be updated based on the determined error value thereby improving the stage trajectory information 452 output by the stage feedback controller 450.

In one embodiment, the stage trajectory information 452 is output directly to the amplifier 470 which translates the stage trajectory information 452 into an electrical signal which is then applied to the stage 106 (as shown in FIG. 1) to drive the stage 106 towards the target position. At the conclusion of stage motion at the end of the stage trajectory defined in signal 452, the stage amplifier 470 inside obtains a command from the stage Feedback Controller 450 and outputs this command as stage electrical signal which is used to generate stage motion. The new stage position is obtained by stage position sensor and is fed back into the second junction 440 and used to determine an error value as discussed above. The stage control command information 452 may be output as $U_{stage}(t)$ (output control signal 472).

In another embodiment, as shown in FIG. 4, the control system includes a third junction 460 disposed between the stage feedback controller 450 and the stage amplifier 470. The third junction 460 combines the stage trajectory information 452 with a third feedforward signal 416 generated and output by the feedforward controller 410. The third feedforward signal 416 is a motion control command prediction signal. In one embodiment, it is generated by obtaining a difference between the target position of the stage where alignment error is substantially zero and the second feedforward signal 414 and multiplying that difference by the proportional gain used by the Stage Feedback Controller 450 to control movement of the stage 106 (FIG. 1). The third feedforward signal 416 may be calculated according to the following equation:

$$FF_3=(POS_{target}-FF_2(t))*P_{gain}$$

where $FF_3$ is the third feedforward signal 416, $POS_{target}$ represents the target stage position where alignment error is substantially zero and $P_{gain}$ represents the gain to be applied by the Stage Feedback Controller 450 to control movement of the stage. The third junction 460 combines $FF_3$ and $U_{stage}(t)$ to generate the stage motion control signal 462 used as an input to the stage Amplifier 470. The stage amplifier 470 translates the signal into a voltage or current (output control signal 472) that is used to drive the stage 106 in accordance with the motion control signal generated by combining the third feedforward signal 416 (FF$_3$) and the stage command information 452 (U$_{stage}$(t)).

By generating and using the third feedforward signal 416 along with the stage trajectory information 452, there is less phase delay attributed to the stage feedback controller processing which results in faster alignment. A further advantage presented by using the third feedforward signal 416 allows for greater design freedom for reducing shear force and to overcome static friction and nonlinear motion friction during the alignment and curing process. Moreover, the third feedforward signal 416 focuses on the residual error between the second feedforward signal 414 and the target position. This advantageously improves the ability to tune the stage trajectory information by updating the stage trajectory information based on the third feedforward signal 416 in order to cause the stage to move along a trajectory that will more quickly align the marks on the substrate and template. It also can be used to minimize the desynchronization between the first and second feedforward caused by nonlinear friction between template and substrate; and reduce the complexity of feedback controllers 430 and 450 designs in dealing with smaller feedback errors.

Figure 7:
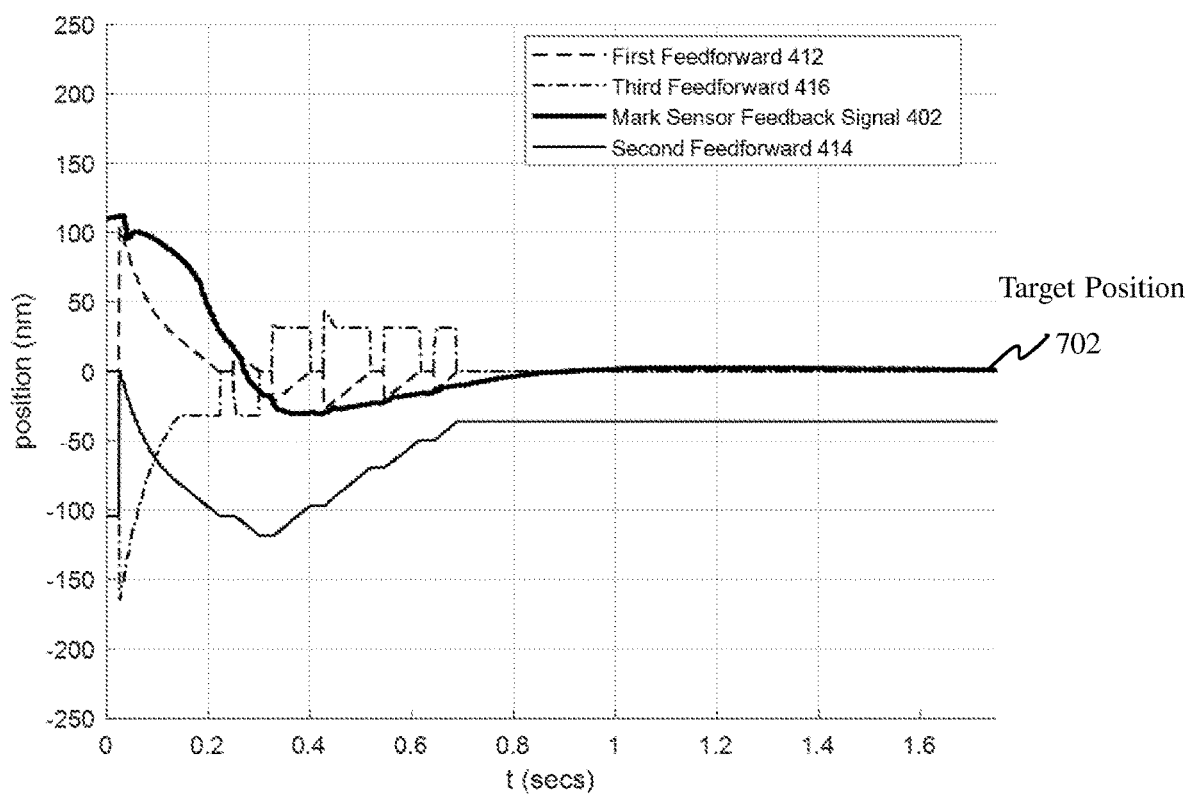
FIG. 7 is a graphical representation of the feedforward signals used to generate the various motion trajectories.

Based on the above, the control system of FIG. 4 advantageously enables the first and second feedforward signals to focus on respective feedback loops thereby allowing the alignment feedback controller 430 and the stage feedback controller 450 to be more easily tuned as their processing focuses on the residual error between current position and respective first and second feedforward trajectory information generated by the feedforward controller 410. This allows the third feedforward signal to be based on the most recent end position of the stage defined by the previous stage trajectories to bring the stage closer to the target position. An exemplary time trace illustrating the feedforward signals is shown in FIG. 7. Time in seconds is shown along the x-axis and position in nanometers is shown on the y-axis. This illustrates positional different at particular time shown the relative distance between the substrate and template from the target position. In FIG. 7, the target mark alignment is represented by target mark distance 0 labeled 702. The first feedforward signal 412 is based on the position information sensed by the mark sensor 158 and begins slightly after an initial time 0 seconds. As indicated herein, the first feedforward signal 412 is used to generate alignment trajectory information. The second feedforward signal 414 which has essentially the same characteristics of the first feedforward signal 412 is offset added and, instead of beginning at the position sensed by sensor 158, is reinitialized to begin from the current stage position, which may be zero for the first initialization or the last stage position before reinitialization. As shown herein, the second feedforward signal 414 is used to generate the stage trajectory information. Based on that, at substantially the same time, the third feedforward signal 416 representing the motion control command prediction information is generated based on the second feedforward signal 414. Because of this, over time, the sensed mark position as indicated in the alignment trajectory and motion prediction information converge which indicates alignment of the substrate and template.

If the initial error from mark sensor is within a predetermined range, then the FeedForward Controller uses the target mark position to replace the first feedforward, and the second and third feedforward are set to zero. If the initial error from the mark sensor is outside the predetermined range, the first feedforward will be generated to bring this mark error to zero, and the second and third feedforward will be generated according to the above description. If the generated feedforwards have been used and the mark error at the end of the trace from the mark sensor is still larger than a predetermined range, the feedforwards will be regenerated based on the mark error at the end of Feedforwards as the new initial error. The second feedforward will also be regenerated by using the end of previous feedforward trace as the starting point. The predetermined range can be position, velocity or acceleration based on mark sensor error. If the error from mark sensor reached the target before feedforward finished the last sample, the feedforward signals can jump to the last sample or keep going until the last ones.

Figure 8A:
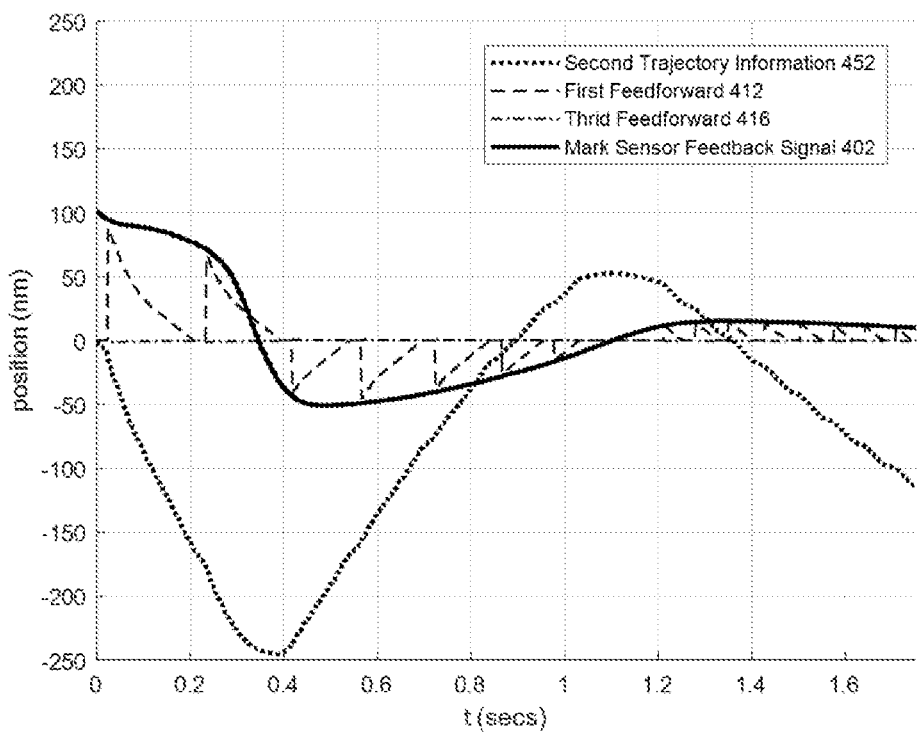
FIGS. 8A and 8B are graphical representations of time it takes for the control signals to converge to the target position.
Figure 8B:
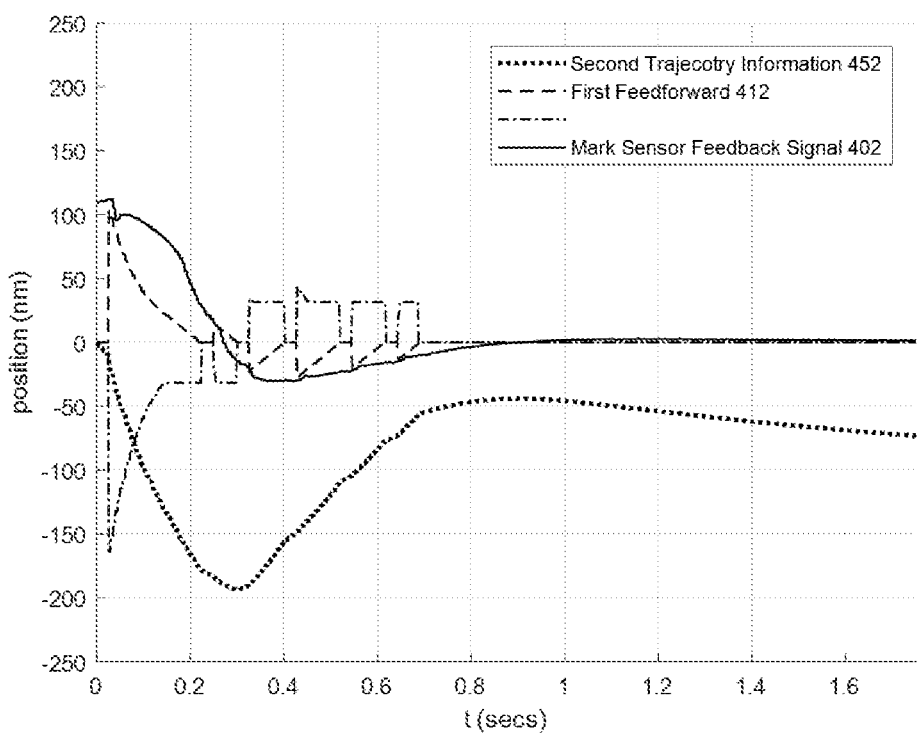

Further advantages of the third feedforward presented by the present control system is clear when looking at FIGS. 8A and 8B which are graphical representations of a length of time it takes for the stage to reach the target position and align the substrate and template using two feedforward control signals (FIG. 8A) and three feedforward control signals (FIG. 8B). As can be seen in FIG. 8B the time for all traces to converge to the target position of zero is reduced as compared to FIG. 8A. This is a direct result of the third feedforward overcoming the time delay and static friction. Another benefit showed is at the end of the stage motion control signal, which is smaller with the third feedforward, overcomes the stalling quicker than two feedforward only scheme. The smaller stage control command force near the end of alignment can reduce the amount of force experienced by the polymerizable material 134 while energy is being supplied for polymerization.

Figure 5A:
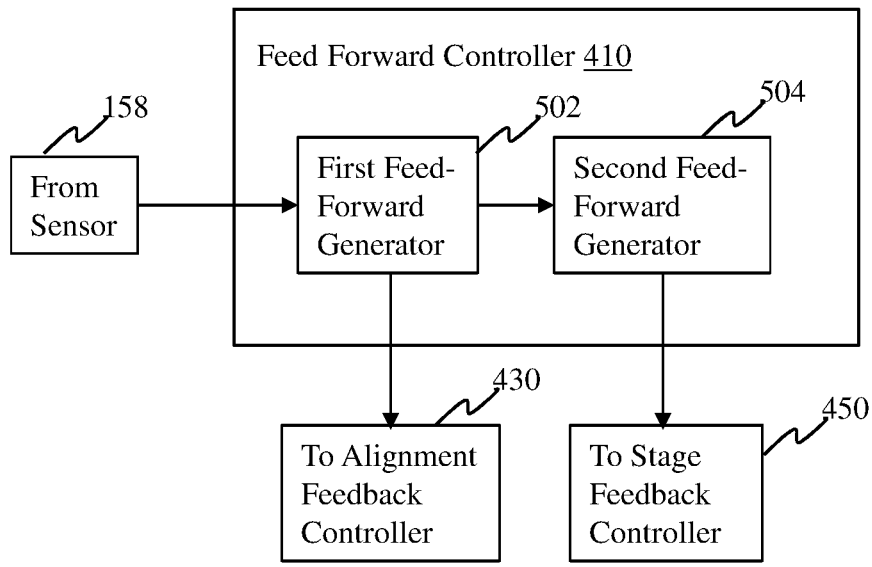
FIG. 5A-5C illustrate different types of feedforward controllers illustrated in FIG. 4.
Figure 5B:
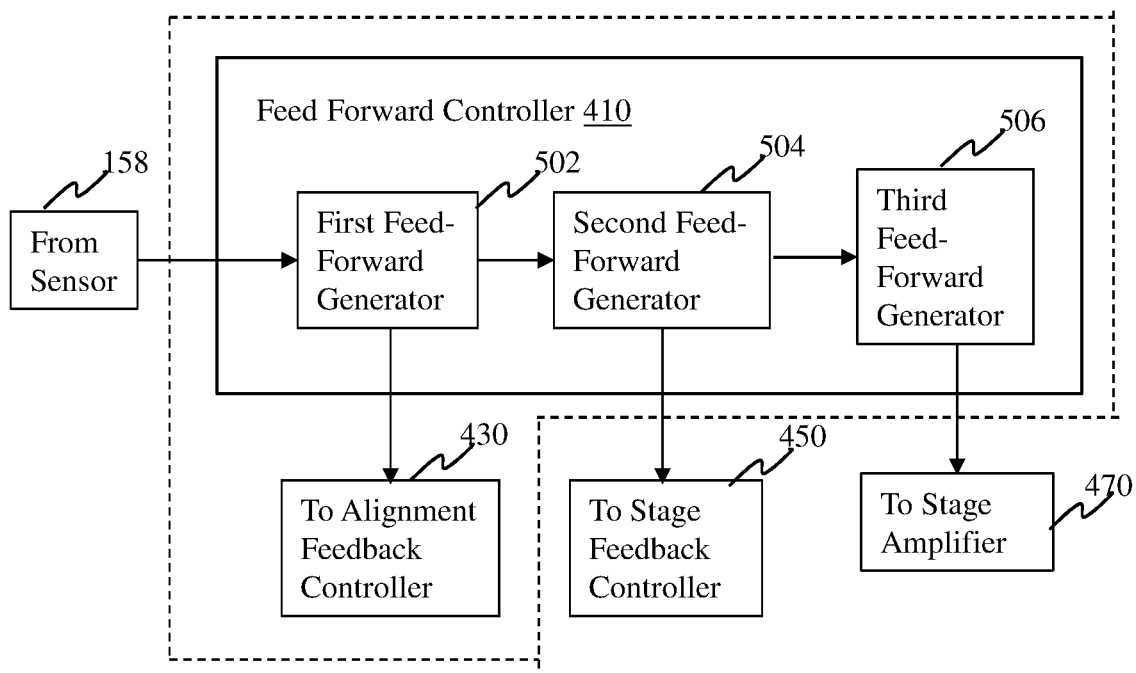
Figure 5C:
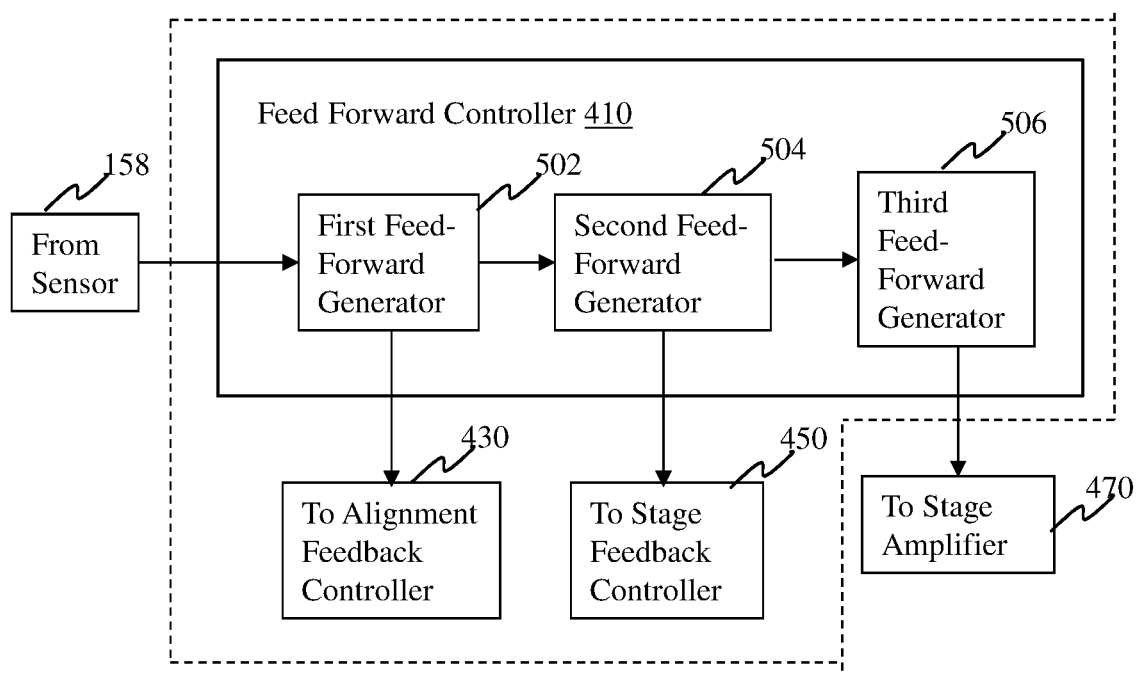

While FIG. 4 illustrates the overall control system as embodied by the various controllers and sensors, FIGS. 5A-5C illustrate additional configurations for how the respective components may be embodied. FIG. 5A illustrates a more detailed view of the feedforward controller 410 in the embodiment where two feedforward control signals are generated and integrated with the various feedback control signals described above. As shown herein, each block may represent a respective CPU that performs the calculations described above. In FIG. 5A, the feedforward controller 410 may include first feedforward generator 502 which is a processing unit (CPU) which receives input from the sensor 158 to generate the first feedforward control signal 412 representing alignment reference trajectory information. In addition, the first feedforward generator 502 can output the first feedforward signal to a second feedforward generator 504 which is a processing unit (either the same as the first feedforward generator or a separate CPU). The second feedforward generator 504 then generates the second feedforward signal 414 for output to the stage controller 450. While shown herein as the signals being output directly to the controllers 430 and 450, it should be noted that this can indicate output to the respective junctions discussed in FIG. 4. Alternatively, the functions performed by the junctions may be encapsulated in each of the alignment feedback controller 430 and stage feedback controller 450. FIG. 5B illustrates an embodiment where the third feedforward signal including motion prediction information may be generated. In this embodiment, the feedforward controller 410 includes a third feedforward generator 506 which itself can be its own processing unit CPU or can be part of a processing unit with one or both of the first and second feedforward generators. Further as can be seed in FIG. 5B by the dotted box, an exemplary configuration embodies the feedforward controller 410 and the alignment feedback controller 430 on a single processing unit separate from the stage feedback controller 450. FIG. 5C includes similar components as those shown in FIG. 5B with the exception that the dotted box indicates that feedforward controller 410, the alignment feedback controller 430 and the stage feedback controller 450 are embodied on a single processing unit.

It should be understood that the above description of the Feedforward controller 410 illustrates at least two but sometimes three feedforward signals being generated and used to control the movement of the stage 106. As noted above, this control can be performed by using the first feedforward signal 412 and the second feedforward signal 414. Further, the above description notes that the third feedforward signal 416 may be used in combination with the first and second feedforward signals 412 and 414. What should also be understood is the algorithm may further use the first feedforward signal with only the third feedforward signal 416 as well. Alternatively, only the second feedforward signal 414 and third feedforward signal 416 may be used as well. The determination as to how and when these three feedforward signals depends on the error calculation performed and whether or not the calculated errors are outside predetermined ranges such that more (or less) aggressive prediction information need be generated to control the stage to move such that the mark on the template is aligned with the mark on the substrate. A goal of the various combinations of the feedforwards signals (412, 414, 416) may be to predict a set of fast and stable position and control trajectories in advance of the control effort. A further goal maybe to make feedback errors (422 and 442) as small as possible. In an embodiment, there is an ideal relationship between the synchronized three feedforwards which may be written as follows:

$$Sys_{412}(FF_1)=Sys_{414}(FF_2)+Sys_{416}(FF_3)$$

where $Sys_{xxx}$ represents the open loop system response with the inputs to the feedforward signals 412, 414, and 416. In another embodiment, the waveforms of three feedforward signals may be determined by a model reference design, iterative learning, and/or repetitive control. In an embodiment, two or more feedforward signals may be optimized in view of one or more of: a coordination system difference between a stage alignment and a mark alignment, nonlinear friction between a substrate and a template.

Figure 6:
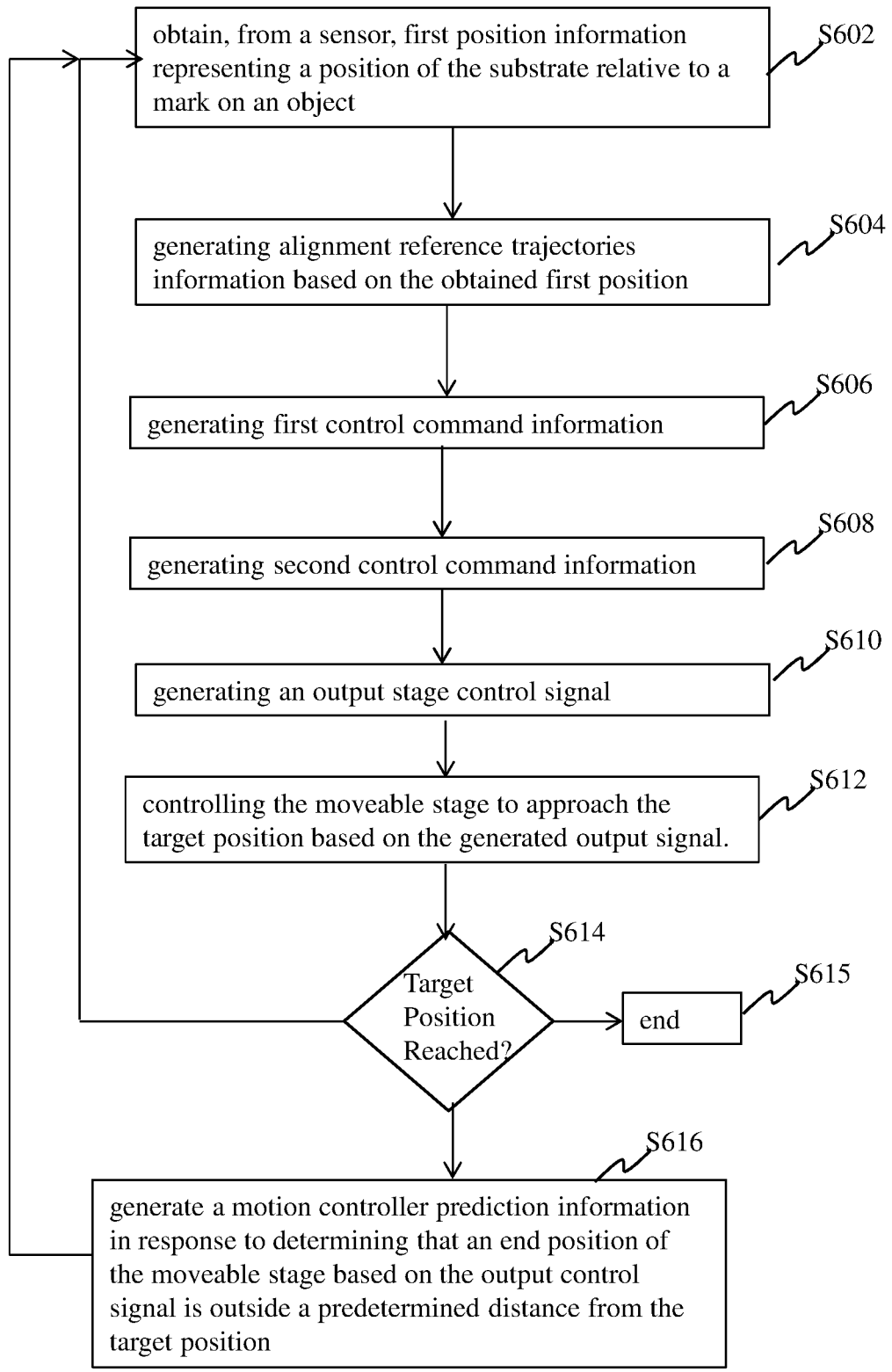
FIG. 6 is a flow diagram detailing an alignment control algorithm.

Turning now to FIG. 6 which shows an exemplary control algorithm for implementing the alignment control in accordance with the present disclosure. The following description will make use of the reference numerals associated with FIGS. 1-4 to indicate the processing units that perform the algorithmic control. As shown herein, the algorithm represents a method of controlling a position of a moveable stage having a substrate supported thereon. In step S602, first position information representing a measured position of the substrate relative to a mark on a template is obtained by the sensor 158. The first position information represents a current measured position of the stage 106 and the relative distance between the marks on the substrate and the template. The first position information is provided to each of the feedforward controller 410 and the alignment feedback controller 430.

In step S604, the feedforward controller 410 generates alignment reference trajectories information based on the obtained first position. The generated alignment reference trajectory information represents the first, second and third feedforward signals 412, 414, and 416 outputs from the feedforward controller 410 and includes at least one parameter value used to control movement of the movable stage to a target position such that a determine alignment error between the marks on the substrate and template is substantially zero. The at least one parameter includes one or more of (a) desired position value, (b) desired velocity value, (c) desired acceleration value and (d) desired start time for initiating movement of the stage along a determined trajectory.

In step S606, first trajectory information is generated by the alignment feedback controller. The first trajectory information represent the alignment trajectory information output by the alignment feedback controller 420 and includes the at least one parameter value based on the obtained first position information and the generated alignment prediction information. The first trajectory information is a first feedback signal 422 generated by obtaining a difference between the obtained first position information and the feedforward alignment reference trajectory information.

In step S608, second trajectory information 452 is generated. The second trajectory information 452 is generated by the stage feedback controller 450 and is generated based on the alignment prediction information and 414 an error value determined from the second reference trajectory information 432 and stage position information 474 representing a current position of the moveable stage. In doing so, the generated second trajectory information 452 includes an updated at least one parameter value which has been updated based on the calculated error value. The second trajectory information represents a second feedback signal generated by combining the second feedforward signal 414, the alignment trajectory information 432 and a position signal representing a current position of the stage 106. In certain embodiments, S608 may also include second error determination processing which determines a second error value based on a current position of the moveable stage that was moved in accordance with the second trajectory information and the target position.

In step S610, the stage feedback controller 450 generates an output control signal 472 including the updated at least one parameter value and output the control signal to the stage Amplifier 470 which controls, in step S612, the moveable stage to approach the target position based on the generated output signal. The output control signal 472 generated in step S610 may also include the third feedforward signal as determined by the second error processing described above such that stage can be controlled in step S612 to move in accordance with the updated parameter values.

In step S614, a determination is made by the sensor 158 as to whether the marks an error value associated with the relative position of the mark on the substrate and the mark on the template are within a predetermined error range. If the result of the determination in S614 is positive indicating that the error value is within an acceptable range, the determination is indicative that the mark on the template and the mark on the substrate are aligned with one another and the control algorithm ends in S615.

If the result of the determination is negative, it is indicative that the mark on the substrate and the mark on the template are not aligned. In this case, the algorithm repeats steps S602-S612. In so doing, each of the information and trajectory values described herein above are updated such that one or more of the parameters contained therein and which are used to control the motion of the stage is modified based on both feedback and feedforward control. These updates are based on updated first position information obtained by the sensor after the moveable stage has moved according to the output control signal 472 and has reached an end position that is not the target position.

In addition to the repeating of steps S602-S612, in response to a negative determination, the algorithm generates in step S616, motion prediction information as a third feedforward signal 416. In this manner, in response to determining that an end position of the moveable stage based on the output control signal 472 is outside a predetermined distance from the target position (e.g. error value larger than a predetermined error threshold), motion controller prediction information is generated and includes updated at least one parameter values determined based on the end position of the moveable stage. The updated at least one parameter values are updated based on a difference between the end position and the second trajectory information. The motion controller prediction information is combined with the second trajectory information to generate an updated output control signal 472 which is then used to control the moveable stage based on the updated output control signal 472.

According the above described algorithm the relative position of the template to the substrate can be successfully controlled by receiving alignment information that represents the relative position of the mark on the template relative to an alignment mark on substrate. Feedforward alignment trajectory based on the alignment information is then generated and may include parameters such as one or more of desired position, desired velocity, desired acceleration, and desired starting time of feedforward alignment trajectory. Based on this, an alignment error time series can be generated which represents feedforward alignment trajectory minus measured alignment trajectory where both of these trajectories include the one or more parameters such as position, velocity, and acceleration. The alignment error time series can be transformed into an alignment closed-loop feedback control output time series which is then used to generate stage trajectory information used by the amplifier as input information as a sum of the alignment closed loop feedback control output time series plus the stage feedforward trajectory. The stage feedback controller receives the stage controller input information and feedback information from the stage position sensor which measures the position of the stage and continually updates and modifies the stage trajectory information is which then used by the Stage Feedback controller in order to drive the position of the stage towards the target.

The present disclosure provides a dynamic feedforward re-initialization mechanism to generate new feedforward trajectory information if an end position of the stage results in the stage not being within a predetermined threshold of the target position. In this manner, the feedforward controller is reinitialized to generate updated feedforward signals based on a most recent position of the stage and as determined by the sensor 158 which senses the relative position between the substrate and the template. Due to the feedforward re-initialization, position errors can be reduced along with feedback gain and complexity of the overall system. In operation the sensor 158 measure of the relative distance between substrate and the template is used to measure the absolute distance of stage movement. Upon acquiring the first sample, the generated feedforward starts at an initial position based on the sensor data and is subsequently re-initialized feedforward is to start from the total control effort resulting in an end position of the stage during the of previous sample. As such the dual Feedback loops can be reinitialized at the beginning of each Feedforward reinitialization. This operation advantageously enables the presently described control system to provide fast consistent alignment for imprint lithography and compensates for the in-liquid fraction of the liquid resist and the physical variation of the substrates at the onset of imprinting. The above algorithm overcomes the drawbacks associated with the variation and nonlinearity associated with feedback control systems to reduce overshoot, undershoot and stalling during imprint lithography. As such, the control algorithm provided herein improves the yield and efficiency in mass production of one or more articles from the substrate.

Therefore, the control algorithm detailed hereinabove can be used in a process for semiconductor manufacturing to manufacture one or more articles or devices. These processes for subjecting the substrate which has been successful aligned in accordance with the control algorithm described herein above include but are not limited to: imprint lithography; photolithography; baking; oxidation; layer formation; deposition; doping; etching; descumming; dicing; bonding; packaging; etc. The substrate can be further processed using other known steps and processes for article fabrication, including, for example, inspection, curing, oxidation, layer formation, deposition, doping, planarization, etching, formable material removal, dicing, bonding, packaging, and the like. Based on the above, the substrate may be processed to produce a plurality of articles (devices).

In one example, the processing may include dispensing an imprint resist (e.g. a liquid) on the substrate and contacting the imprint resist with the object such that object, which has a pattern thereon, contacts the imprint resist. The processing includes alignment processing to align the substrate and object (e.g. template) to a predetermined alignment position and then processing the substrate on which the imprint resist has been dispensed so as to manufacture the articles. In so doing energy is applied to the substrate to cure the resist and form a pattern on the substrate that corresponds to the pattern on the template. This process is repeatedly performed such that the object and substrate are aligned prior to the resist being cured by the applied energy.

A number of implementations have been described. Nevertheless, it will be understood that various modifications may be made without departing from the spirit and scope of the disclosure. Accordingly, other implementations are within the scope of the following claims.

An embodiment of the present disclosure can be carried out by providing a program implementing one or more functions of the above-described embodiment to a system or apparatus via a network or storage medium and reading and executing the program with one or more processors in a computer of the system or apparatus. Also, an embodiment of the present disclosure can be carried out by a circuit implementing one or more functions (for example, an application specific integrated circuit (ASIC)).

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

In referring to the description, specific details are set forth in order to provide a thorough understanding of the examples disclosed. In other instances, well-known methods, procedures, components, and circuits have not been described in detail as not to unnecessarily lengthen the present disclosure.

It should be understood that if an element or part is referred herein as being "on", "against", "connected to", or "coupled to" another element or part, then it may be directly on, against, connected or coupled to the other element or part, or intervening elements or parts may be present. In contrast, if an element is referred to as being "directly on", "directly connected to", or "directly coupled to" another element or part, then there are no intervening elements or parts present. When used, term "and/or", includes any and all combinations of one or more of the associated listed items, if so provided.

Spatially relative terms, such as "under" "beneath", "below", "lower", "above", "upper", "proximal", "distal", and the like, may be used herein for ease of description to describe one element or feature's relationship to another element(s) or feature(s) as illustrated in the various figures. It should be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, a relative spatial term such as "below" can encompass both an orientation of above and below. The device may be otherwise oriented (rotated 90° or at other orientations) and the spatially relative descriptors used herein are to be interpreted accordingly. Similarly, the relative spatial terms "proximal" and "distal" may also be interchangeable, where applicable.

The term "about," as used herein means, for example, within 10%, within 5%, or less. In some embodiments, the term "about" may mean within measurement error.

The terms first, second, third, etc. may be used herein to describe various elements, components, regions, parts and/or sections. It should be understood that these elements, components, regions, parts and/or sections should not be limited by these terms. These terms have been used only to distinguish one element, component, region, part, or section from another region, part, or section. Thus, a first element, component, region, part, or section discussed below could be termed a second element, component, region, part, or section without departing from the teachings herein.

The terminology used herein is for the purpose of describing particular embodiments only and is not intended to be limiting. As used herein, the singular forms "a", "an", and "the", are intended to include the plural forms as well, unless the context clearly indicates otherwise. It should be further understood that the terms "includes" and/or "including", when used in the present specification, specify the presence of stated features, integers, steps, operations, elements, and/or components, but do not preclude the presence or addition of one or more other features, integers, steps, operations, elements, components, and/or groups thereof not explicitly stated.

The foregoing merely illustrates the principles of the disclosure. Various modifications and alterations to the described exemplary embodiments will be apparent to those skilled in the art in view of the teachings herein.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

What is claimed is:

1. A method of controlling a position of a moveable stage having a substrate supported thereon, the method comprising:
   obtaining, from a sensor, first position information representing a position of the substrate relative to a mark on an object;
   generating alignment prediction information based on the obtained first position information, the generated alignment prediction information including at least one parameter value;
   generating first trajectory information including the at least one parameter value based on the obtained first position information and the generated alignment prediction information;
   generating second trajectory information based on the generated alignment prediction information, the first trajectory information, and second position information, wherein the second position information represents a position of the moveable stage;
   generating an output control signal based on the second trajectory information; and
   controlling the moveable stage to approach a target position based on the generated output signal.

2. The method according to claim 1, further comprising:
   determining an error value based on the sensor representing the position of the substrate relative to the mark on the object that was moved in accordance with the second trajectory information; and
   generating an updated output control signal based on the error value is within a predetermined range; and
   controlling the moveable stage to approach the target position based on the updated output control signal.

3. The method according to claim 1, further comprising:
   updating the alignment prediction information and the at least one parameter values included therein based on updated first position information obtained by an image capturing device after the moveable stage has moved according to the output control signal.

4. The method according to claim 1, wherein the alignment prediction information is a first feed-forward signal, and the generated first trajectory information is a first feedback signal generated by obtaining a difference between the obtained first position information and the feed-forward alignment prediction information.

5. The method according to claim 4, wherein the generated second trajectory information is a second feedback signal.

6. The method according to claim 1, further comprising:
   in response to determining an error value based on the sensor representing the position of the substrate relative to the mark on the object at an end position of the alignment prediction information is outside a predetermined range, generating a new alignment prediction information including updated at least one parameter values determined based on an updated first position information; and adjusting one or more control terms used in generating: the alignment prediction information; the first trajectory information; and the second trajectory information; and combining the new alignment prediction information with the second trajectory information to generate an updated output control signal; and controlling the moveable stage based on the updated output control signal.

7. The method according to claim 1, wherein the output control signal is further based on a combination of a third feedforward control signal and the second trajectory information.

8. The method according to claim 1, wherein the at least one parameter includes one or more of (a) desired position value, (b) desired velocity value, (c) desired acceleration value; (d) a desired rotation value, and (e) desired start time for initiating movement of the stage along a determined trajectory.

9. The method according to claim 1, wherein the alignment prediction information includes: a first feedforward control signal; a second feedforward control signal; and a third feedforward control signal;
wherein the generation of the first trajectory information is also based on the first feedforward control signal;
wherein the generation of the second trajectory information is also based on the second feedforward control signal;
wherein the generation of the output control signal is also based on the third feedforward control signal.

10. The method according to claim 1, wherein a feedforward control group consists of the first feedforward control signal; the second feedforward control signal; and the third feedforward control signal; and
wherein at one of the control signals in the feedforward control group is based on one or two of the other control signals in in the feedforward control group.

11. An imprint lithography system for controlling alignment of an imprint lithography template with respect to a substrate, the system comprising:
a stage configured to retain the substrate and which is moveable such that a position of the stage can be modified; and
a sensor configured to sense a position of the substrate relative to the imprint lithography template; and
at least a controller in communication with the stage and the sensor configured to, based on the substrate having a liquid imprint resist contacting the template:
obtain, from a sensor, first position information representing a position of the substrate relative to a mark on an object;
generate alignment prediction information based on the obtained first position information, the generated alignment prediction information including at least one parameter value;
generate first trajectory information including the at least one parameter value based on the obtained first position information and the generated alignment prediction information;
generate second trajectory information based on the generated alignment prediction information, the first trajectory information, and second position information, wherein the second position information represents a position of the moveable stage;
generate an output control signal based on the second trajectory information; and
control the moveable stage to approach a target position based on the generated output signal.

12. The system according to claim 11, wherein the at least one controller if further configured to:
determine an error value based on the sensor representing the position of the substrate relative to the mark on the object that was moved in accordance with the second trajectory information; and
generate an updated output control signal based on the error value is within a predetermined range; and
control the moveable stage to approach the target position based on the updated output control signal.

13. The system according to claim 11, wherein the at least one controller is further configured to:
update the alignment prediction information and the at least one parameter values included therein based on updated first position information obtained by an image capturing device after the moveable stage has moved according to the output control signal.

14. The system according to claim 11, wherein the alignment prediction information is a first feed-forward signal, and the generated first trajectory information is a first feedback signal generated by obtaining a difference between the obtained first position information and the feed-forward alignment prediction information.

15. The system according to claim 14, wherein the generated second trajectory information is a second feedback signal.

16. The system according to claim 11, wherein the at least one controller is further configured to:
in response to determining an error values based on the sensor representing the position of the substrate relative to the mark on the object at an end position of the alignment prediction information is outside a predetermined range, generate a new alignment prediction information including updated at least one parameter values determined based on an updated first position information; and
combine the new alignment prediction information with the second trajectory information to generate an updated output control signal; and
control the moveable stage based on the updated output control signal.

17. The system according to claim 16, wherein the output control signal is further based on combination of a third feedforward control signal and the second trajectory information.

18. The system according to claim 11, wherein the at least one parameter includes one or more of (a) desired position value, (b) desired velocity value, (c) desired acceleration value; (d) a desired rotation value, and (e) desired start time for initiating movement of the stage along a determined trajectory.

19. A method of manufacturing articles including using the method of controlling a moveable stage recited in claim 1, the method of manufacturing articles further comprising:
dispensing an imprint resist on the substrate, the imprint resist being a liquid;
contacting the imprint resist with the object, the object having a pattern thereon that contacts the imprint resist;
processing the substrate on which the imprint resist has been dispensed so as to manufacture the articles.

20. The method of manufacturing according to claim 19, wherein processing the substrate further comprises:
applying energy to the substrate to cure the imprint resist and form a pattern on the substrate that corresponds to the pattern on the object;

wherein the method of controlling the movable stage is repeatedly performed while the object is in contact with the imprint resist, such that the object and substrate are aligned prior to the resist being cured by the applied energy.

21. A method of controlling a position of a moveable stage having an object supported thereon, the method comprising:

obtaining, from a sensor, first position information representing a position of the object;

generating first feedforward information and second feedforward information based on the obtained first position information;

inputting, to a first feedback controller, information based on the obtained first position information and the generated first feedforward information;

inputting, to a second feedback controller, information based on the generated second feedforward information, output from the first feedback controller, and second position information representing a position of the moveable stage; and controlling the moveable stage based on output from the second feedback controller.

22. A system for controlling a position of a moveable stage having an object supported thereon, the system comprising:

a controller configured to control a position of the moveable stage, wherein the controller comprises:

a feedforward controller configured to generate first feedforward information and second feedforward information based on first position information representing a position of the object from a sensor configured to sense a position of the object;

a first feedback controller configured to obtain information based on the obtained first position information and the generated first feedforward information; and a second feedback controller configured to obtain information based on the generated second feedforward information, output from the first feedback controller, and second position information representing a position of the moveable stage, and wherein the controller controls the moveable stage based on output from the second feedback controller.

23. A method of manufacturing an article, the method comprising:

dispensing an imprint resist on a substrate supported by a moveable stage;

contacting the imprint resist with an object, the object having a pattern thereon that contacts the imprint resist;

controlling the moveable stage using the method recited in claim 21;

processing the substrate on which the imprint resist has been formed by the pattern so as to manufacture the article.

* * * * *